US011307060B2

(12) United States Patent
Suzuki et al.

(10) Patent No.: US 11,307,060 B2
(45) Date of Patent: Apr. 19, 2022

(54) LIGHT-RECEIVING MODULE FOR ENCODER, AND ENCODER

(71) Applicant: HAMAMATSU PHOTONICS K.K., Hamamatsu (JP)

(72) Inventors: Takayuki Suzuki, Hamamatsu (JP); Yuji Tsuji, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 39 days.

(21) Appl. No.: 16/617,160

(22) PCT Filed: Mar. 22, 2018

(86) PCT No.: PCT/JP2018/011376
§ 371 (c)(1),
(2) Date: Nov. 26, 2019

(87) PCT Pub. No.: WO2018/220958
PCT Pub. Date: Dec. 6, 2018

(65) Prior Publication Data
US 2020/0109969 A1  Apr. 9, 2020

(30) Foreign Application Priority Data

May 31, 2017  (JP) .............................. JP2017-107863

(51) Int. Cl.
*G01D 5/347*  (2006.01)
*G02B 6/26*  (2006.01)
*G02B 6/38*  (2006.01)

(52) U.S. Cl.
CPC ........... *G01D 5/3473* (2013.01); *G02B 6/262* (2013.01); *G02B 6/3897* (2013.01)

(58) Field of Classification Search
CPC .. G01D 5/3473; G01D 5/34723; G02B 6/262; G02B 6/3897; H01L 31/02; H01L 31/0232
See application file for complete search history.

(56) References Cited

U.S. PATENT DOCUMENTS

| 4,953,933 A | 9/1990 | Asmar |
| 5,670,781 A * | 9/1997 | Setbacken ............... G01D 5/347 250/231.16 |
| 2019/0376818 A1* | 12/2019 | Fukuda .............. G01D 5/34723 |

FOREIGN PATENT DOCUMENTS

| CN | 101031780 A | 9/2007 |
| CN | 104321702 A | 1/2015 |

(Continued)

OTHER PUBLICATIONS

International Preliminary Report on Patentability dated Dec. 12, 2019 for PCT/JP2018/011376.

*Primary Examiner* — Seung C Sohn
(74) *Attorney, Agent, or Firm* — Faegre Drinker Biddle & Reath LLP (57) ABSTRACT

A light-receiving module includes a support body having a bottom wall part and a side wall part, a light-receiving element disposed on the bottom wall part such that a light-receiving surface faces one side and surrounded by the side wall part when viewed from the one side, and a fiber optic plate having an input surface constituted by surfaces of one end of a plurality of optical fibers and an output surface constituted by surfaces of the other end of the plurality of optical fibers and disposed on the light-receiving element such that the output surface faces the light-receiving surface. An end surface of the side wall part on the one side is positioned more to the one side than the light-receiving surface and the input surface is positioned more to the one side than the end surface.

5 Claims, 4 Drawing Sheets

(56) References Cited

FOREIGN PATENT DOCUMENTS

| | | |
|---|---|---|
| CN | 204286464 U | 4/2015 |
| CN | 106471339 A | 3/2017 |
| CN | 106527070 A | 3/2017 |
| EP | 0198549 A2 | 10/1986 |
| EP | 0814517 A2 | 12/1997 |
| EP | 3086376 A1 | 10/2016 |
| JP | 3064227 B2 | 7/2000 |
| JP | 2005-37333 A | 2/2005 |
| JP | 2007-256692 A | 10/2007 |
| JP | 2008-151529 A | 7/2008 |
| JP | 2015-118046 A | 6/2015 |
| WO | WO 03/012477 A1 | 2/2003 |

* cited by examiner

LIGHT-RECEIVING MODULE FOR ENCODER, AND ENCODER

TECHNICAL FIELD

An aspect of the present invention relates to a light-receiving module for an encoder and an encoder.

BACKGROUND ART

Known is an encoder provided with a rotary plate having a light passage pattern, a light source disposed on one side with respect to the rotary plate, and a light-receiving element disposed on the other side with respect to the rotary plate (see, for example, Patent Literature 1).

CITATION LIST

Patent Literature

Patent Literature 1: Japanese Unexamined Patent Publication No. 2005-37333

SUMMARY OF INVENTION

Technical Problem

Regarding the encoder as described above, it is conceivable to dispose the light-receiving element on a support body having a bottom wall part and a side wall part in order to protect the light-receiving element from physical contact and the like. More specifically, it is conceivable to dispose the light-receiving element on the bottom wall part so as to be surrounded by the side wall part when viewed from one side. However, even after the light-receiving element is disposed on the bottom wall part such that a light-receiving surface faces one side, the light-receiving surface can be brought close to the light passage pattern only until immediately before contact of the side wall part with the rotary plate. Also, in a case where a fixed plate having a light passage pattern is provided together with the rotary plate, the light-receiving surface can be brought close to the light passage pattern only until immediately before contact of the side wall part with the rotary plate or the fixed plate. When the light-receiving surface cannot be brought close to the light passage pattern, the detection accuracy of the encoder may be reduced due to light diffusion or the like.

An object of an aspect of the present invention is to provide a light-receiving module for an encoder with which it is possible to obtain satisfactory detection accuracy in the case of application to an encoder while protecting a light-receiving element and an encoder provided with the light-receiving module.

Solution to Problem

A light-receiving module for an encoder according to an aspect of the present invention includes a support body having a bottom wall part and a side wall part disposed on the bottom wall part on one side of the bottom wall part, a light-receiving element having a light-receiving surface, disposed on the bottom wall part such that the light-receiving surface faces the one side, and surrounded by the side wall part when viewed from the one side, and a fiber optic plate having an input surface constituted by surfaces of one end of a plurality of optical fibers and an output surface constituted by surfaces of the other end of the plurality of optical fibers and disposed on the light-receiving element such that the output surface faces the light-receiving surface. An end surface of the side wall part on the one side is positioned more to the one side than the light-receiving surface and the input surface is positioned more to the one side than the end surface.

In this light-receiving module for an encoder, the end surface of the side wall part on the one side is positioned more to the one side than the light-receiving surface of the light-receiving element. As a result, the light-receiving element can be reliably protected from physical contact, for example. In addition, the fiber optic plate is disposed on the light-receiving element such that the output surface faces the light-receiving surface. As a result, the light incident on the input surface can be reliably guided to the light-receiving surface. Further, the input surface of the fiber optic plate is positioned more to the one side than the end surface of the side wall part on the one side. As a result, the input surface can be brought close to the light passage pattern of the encoder. As a result, it is possible to suppress light being diffused and incident on the light-receiving surface after passing through the light passage pattern. Accordingly, with the light-receiving module for an encoder, it is possible to obtain satisfactory detection accuracy in the case of application to the encoder while protecting the light-receiving element.

The light-receiving module for an encoder according to an aspect of the present invention may further include a wire connected to wiring provided at the bottom wall part and a terminal provided at the light-receiving element inside the side wall part and a resin member disposed on the bottom wall part inside the side wall part and covering the wiring, the terminal, and the wire. The end surface may be positioned more to the one side than the wire and the input surface may be positioned more to the one side than the resin member. According to this, because the wiring, the terminal, and the wire are covered by the resin member, the wiring, the terminal, and the wire can be protected from, for example, oil scattered when the encoder is used. In addition, because the end surface of the side wall part is positioned more to the one side than the wire, it is possible to suppress an external force acting on the wire. Further, the input surface can be brought close to the light passage pattern of the encoder without being disturbed by the resin member.

In the light-receiving module for an encoder according to an aspect of the present invention, the fiber optic plate may be fixed to the light-receiving element by the resin member. According to this, a configuration for fixing the fiber optic plate to the light-receiving element can be omitted and a configuration can be simplified.

The light-receiving module for an encoder according to an aspect of the present invention may further include a light-shielding layer having a light passage pattern and disposed between the light-receiving surface and the output surface. According to this, the light that has passed through the light passage pattern of the rotary plate of the encoder can be appropriately incident on the light-receiving surface. In addition, the light passage pattern of the light-shielding layer and the light-receiving surface are close to each other, and thus positional accuracy can be improved between the light passage pattern of the light-shielding layer and the light-receiving surface. In addition, the light passage pattern of the light-shielding layer and the light-receiving surface are transferred onto the input surface via the output surface, and thus the light passage pattern of the light-shielding layer and the light-receiving surface can be optically close to the light passage pattern of the rotary plate. As a result, the detection accuracy in the case of application to the encoder becomes more satisfactory.

An encoder according to an aspect of the present invention includes a rotary plate having a light passage pattern, a light source disposed on one side with respect to the rotary plate, and the light-receiving module for an encoder disposed on the other side with respect to the rotary plate. With this encoder, it is possible to obtain satisfactory detection accuracy while protecting the light-receiving element as described above.

Advantageous Effects of Invention

According to an aspect of the present invention, a light-receiving module for an encoder with which it is possible to obtain satisfactory detection accuracy in the case of application to an encoder while protecting a light-receiving element and an encoder provided with the light-receiving module can be provided.

DESCRIPTION OF EMBODIMENTS

Hereinafter, an embodiment according to an aspect of the present invention will be described in detail with reference to accompanying drawings. In the following description, the same or corresponding elements will be denoted by the same reference numerals without redundant description.

Figure 1:
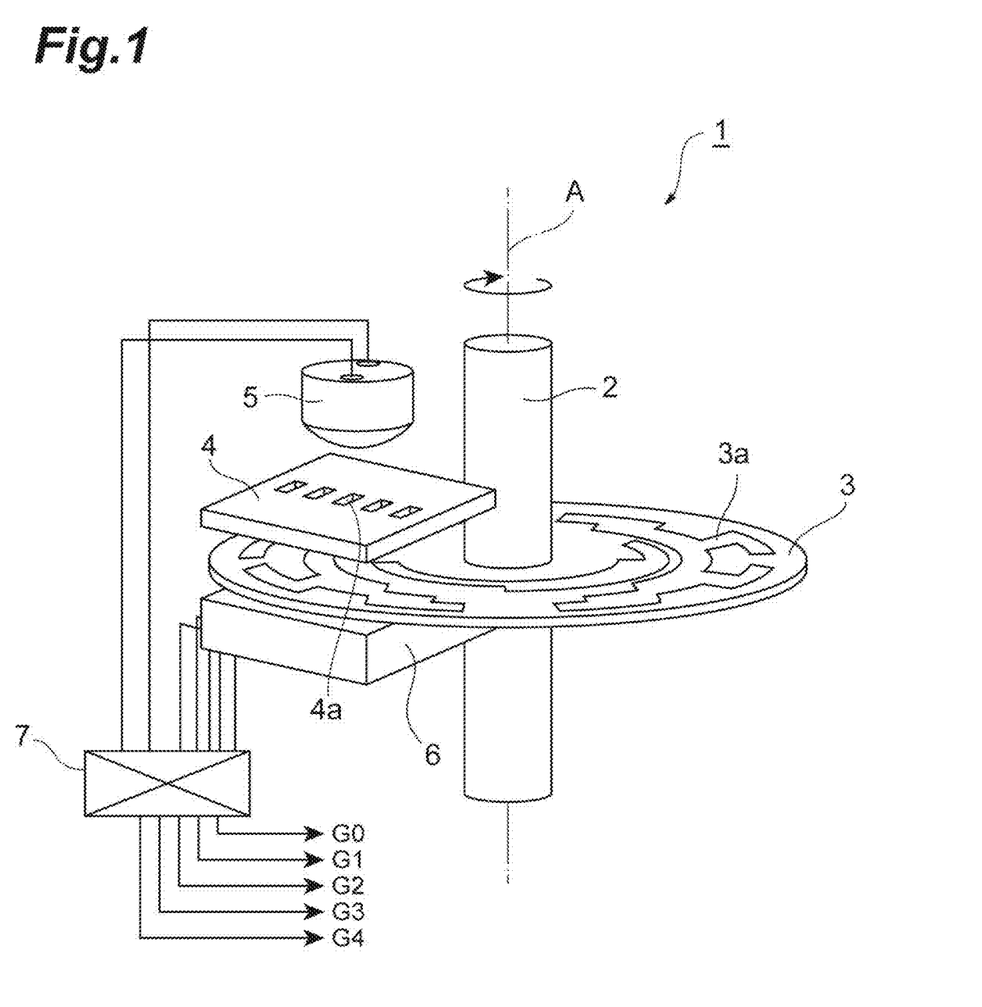
FIG. 1 is a perspective view of an encoder according to an embodiment.

As illustrated in FIG. 1, an encoder 1 comprises a rotating shaft 2, a rotary plate 3, a fixed plate 4, a light source 5, a light-receiving module 6, and a processing unit 7. The rotating shaft 2 rotates around an axis A as a center line. The encoder 1 is a so-called absolute type rotary encoder and is a device for detecting the absolute angle of a measurement object connected to the rotating shaft 2.

The rotary plate 3 is fixed to the rotating shaft 2 and rotates with the rotating shaft 2. The rotary plate 3 is formed in a disk shape and is attached to the rotating shaft 2 at a central part so as to be orthogonal to the axis A, for example. The rotary plate 3 has a light passage pattern 3a representing a predetermined pattern such as a gray code. The light passage pattern 3a is constituted by a plurality of slits penetrating the rotary plate 3. The insides of the slits may be air gaps or a transparent glass part may be disposed in the slit.

The fixed plate 4 is fixed at a position facing the rotary plate 3. The fixed plate 4 is formed in, for example, a rectangular plate shape and is disposed in parallel with the rotary plate 3. The fixed plate 4 has a light passage pattern 4a formed so as to be positioned on a straight line connecting the light source 5 and the light passage pattern 3a of the rotary plate 3. The light passage pattern 4a is constituted by a plurality of slits penetrating the fixed plate 4. In the present embodiment, five slits are arranged side by side along the radial direction of the rotary plate 3. The insides of the slits may be air gaps or a transparent glass part may be disposed in the slit.

The light source 5 is a light emitting element such as a light emitting diode (LED). The light source 5 is fixed at a position opposite to the rotary plate 3 with respect to the fixed plate 4 and emits light toward the rotary plate 3. The light-receiving module 6 is fixed at a position opposite to the light source 5 with respect to the rotary plate 3 and the fixed plate 4. The light-receiving module 6 has a plurality of light-receiving surfaces 21a (FIGS. 2 and 3) and detects light incident on each light-receiving surface 21a.

In the encoder 1, the light from the light source 5 passes through the rotary plate 3 and the fixed plate 4 and is incident on the light-receiving surface 21a when the light passage pattern 3a of the rotary plate 3 and the light passage pattern 4a of the fixed plate 4 overlap on a straight line connecting the light source 5 and the light-receiving surface 21a of the light-receiving module 6. In a case where the light passage pattern 3a and the light passage pattern 4a do not overlap, the light from the light source 5 is blocked by the rotary plate 3 and is not incident on the light-receiving surface 21a. The processing unit 7 is a signal processing circuit or the like, encodes the light detection result in each light-receiving surface 21a, and outputs gray codes G0, G1, G2, G3, and G4 representing the absolute value of the rotation angle of the rotating shaft 2.

Figure 2:
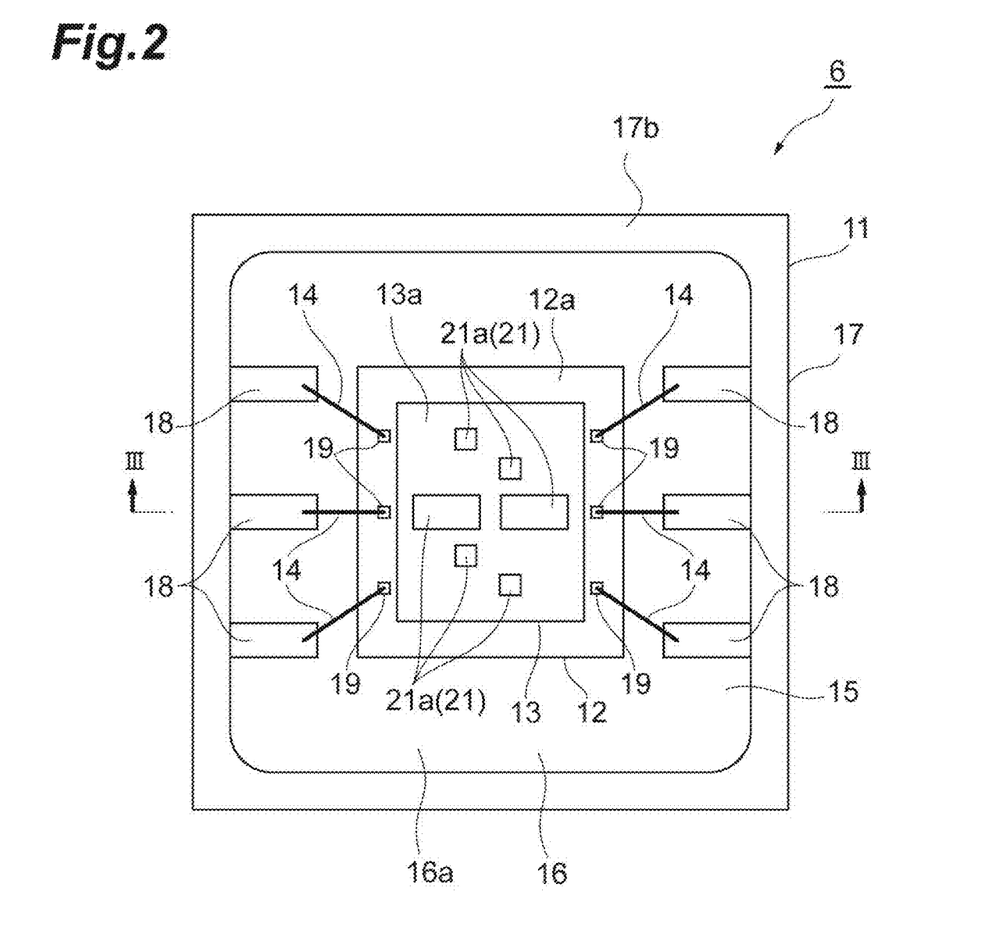
FIG. 2 is a plan view of the light-receiving module that is illustrated in FIG. 1.
Figure 3:
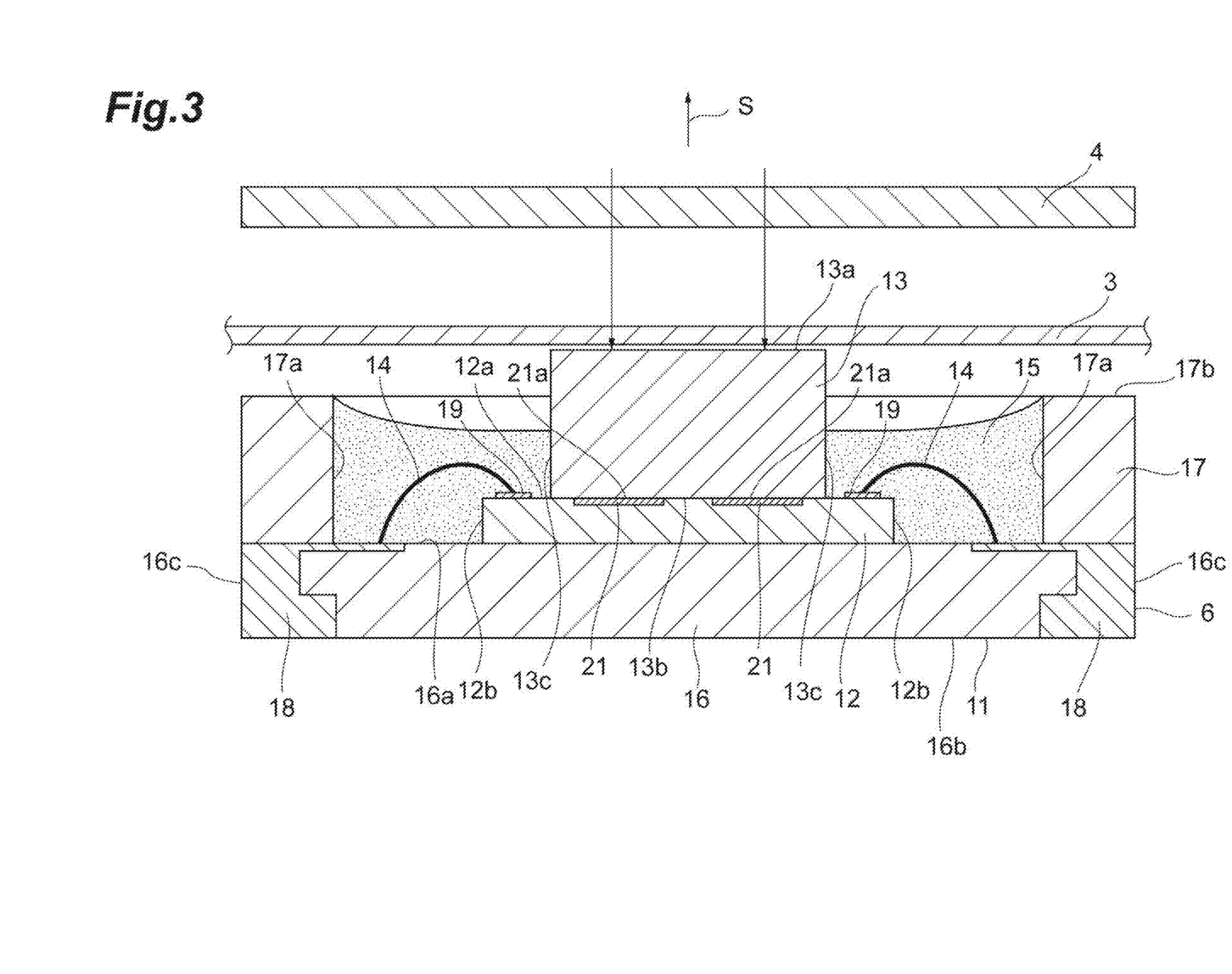
FIG. 3 is a cross-sectional view taken along line in FIG. 2.

The configuration of the light-receiving module 6 will be further described below. As illustrated in FIGS. 2 and 3, the light-receiving module 6 comprises a support body 11, a light-receiving element 12, a fiber optic plate (hereinafter, also referred to as "FOP") 13, a wire 14, and a resin member 15.

The support body 11 is a substantially rectangular parallelepiped box having one open surface and has a rectangular plate-shaped bottom wall part 16 and a side wall part 17 disposed on the bottom wall part 16 on one side S of the bottom wall part 16. The side wall part 17 is provided along the outer edge of the bottom wall part 16 and has a rectangular ring shape when viewed from the one side S. The support body 11 is formed by, for example, lamination of the bottom wall part 16 and the side wall part 17 both made of glass epoxy resin.

The bottom wall part 16 is provided with a plurality of wirings 18 for outputting a signal from the light-receiving module 6 to the outside. The wiring 18 is exposed to a main surface 16a of the bottom wall part 16 on the one side S, a main surface 16b opposite to the main surface 16a, and a side surface 16c connected to the main surfaces 16a and 16b.

The light-receiving element 12 is a rectangular plate-shaped light-receiving chip and has a plurality of light-receiving parts 21. The light-receiving part 21 is a photodiode, a photodiode array, or the like and has the light-receiving surface 21a on one surface 12a side of the light-receiving element 12. The light-receiving element 12 is disposed (fixed) on the bottom wall part 16 such that the light-receiving surface 21a faces the one side S. The light-receiving element 12 is surrounded by the side wall part 17 when viewed from the one side S. The one surface 12a of the light-receiving element 12 is provided with a plurality of terminals 19 for outputting a signal from the light-receiving part 21. In the one surface 12a, each light-receiving surface 21a is disposed in the region close to the center and each terminal 19 is disposed outside the region.

The FOP 13 is an optical device constituted by a plurality of (multiple) optical fibers being bundled. For example, the FOP 13 includes tens of millions of optical fibers each having a diameter of several nm to tens of nm. The FOP 13 has, for example, a rectangular parallelepiped shape and has an input surface 13a and an output surface 13b opposing each other. The input surface 13a is constituted by surfaces of one end of the plurality of optical fibers and the output surface 13b is constituted by surfaces of the other end of the plurality of optical fibers. The FOP 13 is disposed on the light-receiving element 12 such that the output surface 13b faces the light-receiving surface 21a of the light-receiving part 21. More specifically, the output surface 13b faces the region close to the center in the one surface 12a where the light-receiving surface 21a is disposed.

In the FOP 13, light incident on the input surface 13a propagates in the optical fiber and is output from the output surface 13b. More specifically, light incident at a certain position on the input surface 13a is emitted from a position corresponding to the position on the output surface 13b. Accordingly, by disposing the FOP 13 on the light-receiving element 12, the light incident on the input surface 13a can be reliably guided to the light-receiving surface 21a without being diffused.

The wire 14 is a bonding wire electrically connecting the wiring 18 and the terminal 19 to each other inside the side wall part 17. One end of the wire 14 is coupled to the exposed part of the wiring 18 on the main surface 16a side and the other end of the wire 14 is coupled to the terminal 19. The wire 14 has an intermediate part curved so as to be convex toward the one side S.

The resin member 15 is disposed on the bottom wall part 16 inside the side wall part 17. The resin member 15 covers the exposed part of the wiring 18 on the main surface 16a side, the terminal 19, and the wire 14 and is coupled to the main surface 16a of the bottom wall part 16, an inner surface 17a of the side wall part 17, the one surface 12a and a side surface 12b of the light-receiving element 12, and a side surface 13c of the FOP 13. When viewed from the one side S, the resin member 15 has a rectangular ring shape surrounding the FOP 13.

The resin member 15 enters (interposed) between the one surface 12a of the light-receiving element 12 and the output surface 13b of the FOP 13 and fixes the FOP 13 to the light-receiving element 12. The resin member 15 is formed by, for example, potting of a transparent resin such as a silicone resin. During the potting, the uncured resin material injected onto the main surface 16a of the bottom wall part 16 is blocked by the inner surface 17a of the side wall part 17.

The positional relationship of each part as viewed from a direction along the main surface 16a of the bottom wall part 16 will be described below with reference to FIG. 3. An end surface 17b of the side wall part 17 on the one side S is positioned more to the one side S than the light-receiving surface 21a (one surface 12a) of the light-receiving element 12 and the input surface 13a is positioned more to the one side S than the end surface 17b. The end surface 17b is positioned more to the one side S than the wire 14 and the input surface 13a is positioned more to the one side S than the resin member 15. In the present embodiment, the end surface 17b, the light-receiving surface 21a, and the input surface 13a are parallel to one another.

The light-receiving module 6 configured as described above is fixed at a position where the input surface 13a of the FOP 13 faces and is in proximity to the light passage pattern 3a of the rotary plate 3. As described above, the light from the light source 5 passes through the rotary plate 3 and the fixed plate 4 when the light passage pattern 3a of the rotary plate 3 and the light passage pattern 4a of the fixed plate 4 overlap on a straight line connecting the light source 5 and the light-receiving surface 21a. After passing through the rotary plate 3 and the fixed plate 4, the light is incident on the input surface 13a, is guided by the FOP 13, and is incident on the light-receiving surface 21a. As a result, the light is detected on each light-receiving surface 21a.

As described above, in the light-receiving module 6, the end surface 17b of the side wall part 17 is positioned more to the one side S than the light-receiving surface 21a of the light-receiving element 12. As a result, the light-receiving element 12 can be reliably protected from physical contact and the like. The FOP 13 is disposed on the light-receiving element 12 such that the output surface 13b faces the light-receiving surface 21a. As a result, the light incident on the input surface 13a can be reliably guided to the light-receiving surface 21a. The input surface 13a of the FOP 13 is positioned more to the one side S than the end surface 17b of the side wall part 17. As a result, the input surface 13a can be brought close to the light passage pattern 3a of the encoder 1. As a result, it is possible to suppress light being diffused and incident on the light-receiving surface 21a after passing through the light passage pattern 3a. Accordingly, with the light-receiving module 6, it is possible to obtain satisfactory detection accuracy in the case of application to the encoder 1 while protecting the light-receiving element 12.

It is conceivable to use the light source 5 emitting light with high parallelism as means for suppressing light being diffused and incident on the light-receiving surface 21a after passing through the light passage pattern 3a in a case where the light-receiving surface 21a of the light-receiving element 12 cannot be brought close to the light passage pattern 3a as in the above-described conventional encoder. In the light-receiving module 6, in contrast, it is possible to suppress light being diffused and incident on the light-receiving surface 21a after passing through the light passage pattern 3a by bringing the input surface 13a close to the light passage pattern 3a, and thus the light source 5 emitting light with high parallelism does not necessarily have to be used. Accordingly, it is possible to improve the degree of freedom in selecting the light source 5.

The light-receiving module 6 further includes the wire connected to the wiring 18 and the terminal 19 and the resin member 15 covering the wiring 18, the terminal 19, and the wire 14. The end surface 17b of the side wall part 17 is positioned more to the one side S than the wire 14 and the input surface 13a is positioned more to the one side S than the resin member 15. As a result, the wiring 18, the terminal 19, and the wire 14 are covered by the resin member 15, and thus the wiring 18, the terminal 19, and the wire 14 can be protected from, for example, oil scattered when the encoder 1 is used. Because the end surface 17b of the side wall part 17 is positioned more to the one side S than the wire 14, it is possible to suppress an external force acting on the wire 14. Further, the input surface 13a can be brought close to the light passage pattern 3a of the encoder 1 without being disturbed by the resin member 15.

In the light-receiving module 6, the FOP 13 is fixed to the light-receiving element 12 by the resin member 15. As a result, a configuration for fixing the FOP 13 to the light-receiving element 12 can be omitted and simplification can be achieved in terms of configuration.

Although an embodiment according to an aspect of the present invention has been described above, an aspect of the present invention is not limited to the embodiment described above. For example, various materials and shapes can be adopted, without being limited to the above-described materials and shapes, for the material and the shape of each configuration.

Figure 4:
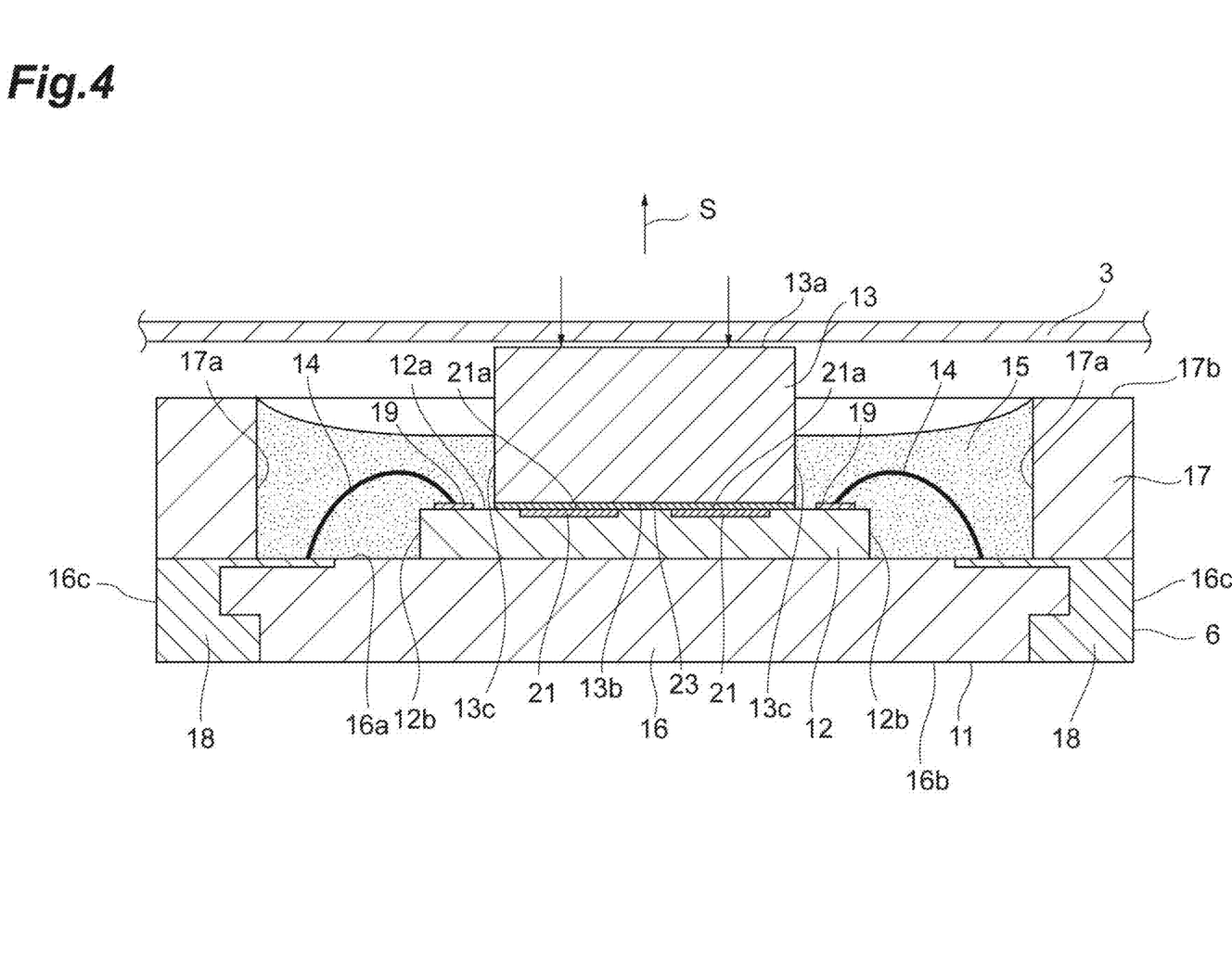
FIG. 4 is a cross-sectional view of a light-receiving module according to a modification example.

The fixed plate 4 may be omitted in the encoder 1 of the above embodiment. In this case, the light-receiving module 6 is disposed such that the input surface 13a of the FOP 13 faces the light passage pattern 3a of the rotary plate 3. In a case where the fixed plate 4 is omitted, the light-receiving module 6 may be configured as in the modification example that is illustrated in FIG. 4. In this modification example, the light-receiving module 6 further includes a light-shielding layer 23 disposed between the light-receiving surface 21a of the light-receiving element 12 and the output surface 13b of the FOP 13. The light-shielding layer 23 is provided on the light-receiving surface 21a. More specifically, the light-shielding layer 23 is provided in the region of the one surface 12a of the light-receiving element 12 that faces the output surface 13b. The light-shielding layer 23 has a light passage pattern formed at a position corresponding to the light passage pattern 4a of the fixed plate 4 and blocks the light from the light source 5 at the part other than the light passage pattern. The light passage pattern is formed by, for example, a part of the light-shielding layer 23 being removed by patterning.

With this modification example, it is possible to obtain satisfactory detection accuracy while protecting the light-receiving element 12 as in the above embodiment. In addition, the light that has passed through the light passage pattern 3a of the rotary plate 3 can be appropriately incident on the light-receiving surface 21a. In addition, the light passage pattern of the light-shielding layer 23 and the light-receiving surface 21a are close to each other, and thus positional accuracy can be improved between the light passage pattern of the light-shielding layer 23 and the light-receiving surface 21a. In addition, the light passage pattern of the light-shielding layer 23 and the light-receiving surface 21a are transferred onto the input surface 13a via the output surface 13b, and thus the light passage pattern of the light-shielding layer 23 and the light-receiving surface 21a can be optically close to the light passage pattern of the rotary plate 3. As a result, the detection accuracy in the case of application to the encoder 1 becomes more satisfactory. In the modification example described above, the light-shielding layer 23 may be provided on the output surface 13b of the FOP 13. The light-shielding layer 23 may be provided on the input surface 13a of the FOP 13. In the FOP 13, light incident at a certain position on the input surface 13a propagates in the optical fiber and is emitted from a position corresponding to the position on the output surface 13b. Accordingly, the light that has passed through the light-shielding layer 23 on the input surface 13a is incident at a certain position on the input surface 13a, is emitted from a position corresponding to the position on the output surface 13b, and is incident on the light-receiving surface 21a of the light-receiving element 12, and thus substantially the same effect as in a case where the light-shielding layer 23 is formed on the light-receiving surface 21a can be obtained.

Although the light source 5, the fixed plate 4, the rotary plate 3, and the light-receiving module 6 are disposed in this order in the encoder 1 of the above embodiment, the light source 5, the rotary plate 3, the fixed plate 4, and the light-receiving module 6 may be disposed in this order. In this case, the light-receiving module 6 is disposed such that the input surface 13a of the FOP 13 faces the light passage pattern 4a of the fixed plate 4. With this modification example as well as the above embodiment, it is possible to suppress light being diffused and incident on the light-receiving surface 21a after passing through the light passage pattern 4a, and thus it is possible to obtain satisfactory detection accuracy while protecting the light-receiving element 12.

The wire 14 may be omitted in the above embodiment. For example, the wiring 18 may be provided at a position facing the back surface of the light-receiving element 12 on the main surface 16a of the bottom wall part 16, the terminal 19 may be provided on the back surface side of the light-receiving element 12, and the wiring 18 and the terminal 19 may be connected on the back surface side of the light-receiving element 12. The resin member 15 may be omitted in this case. The FOP 13 may be fixed to the light-receiving element 12 by an adhesive or the like instead of the resin member 15. The encoder according to an aspect of the present invention may be applied to an increment type encoder.

REFERENCE SIGNS LIST

1: encoder, 3: rotary plate, 5: light source, 6: light-receiving module, 11: support body, 12: light-receiving element, 13: fiber optic plate, 13a: input surface, 13b: output surface, 14: wire, 15: resin member, 16: bottom wall part, 17: side wall part, 18: wiring, 19: terminal, 21a: light-receiving surface, 23: light-shielding layer.

The invention claimed is:

1. A light-receiving module for an encoder, the light-receiving module comprising:
   a support body having a bottom wall part and a side wall part disposed on a main surface of the bottom wall part on one side of the bottom wall part;
   a light-receiving element having a light-receiving surface, disposed on the main surface of the bottom wall part such that the light-receiving surface faces the one side, and surrounded by the side wall part when viewed from the one side; and
   a fiber optic plate having an input surface constituted by surfaces of one end of a plurality of optical fibers and an output surface constituted by surfaces of the other end of the plurality of optical fibers and disposed on the light-receiving element such that the output surface faces the light-receiving surface,
   wherein, when viewed from a direction along the main surface of the bottom wall part, an end surface of the side wall part on the one side is positioned more distant to the one side than the light-receiving surface with respect to the main surface of the bottom wall part, and the input surface is positioned more distant to the one side than the end surface with respect to the main surface of the bottom wall part.

2. The light-receiving module for an encoder according to claim 1, further comprising:
   a wire connected to wiring provided at the bottom wall part and a terminal provided at the light-receiving element inside the side wall part; and
   a resin member disposed on the bottom wall part inside the side wall part and covering the wiring, the terminal, and the wire,
   wherein the end surface is positioned more to the one side than the wire and the input surface is positioned more to the one side than the resin member.

3. The light-receiving module for an encoder according to claim 2, wherein the fiber optic plate is fixed to the light-receiving element by the resin member.

4. The light-receiving module for an encoder according to claim 1, further comprising a light-shielding layer having a light passage pattern and disposed between the light-receiving surface and the output surface.

5. An encoder comprising:
a rotary plate having a light passage pattern;
a light source disposed on one side with respect to the rotary plate; and
the light-receiving module for an encoder according to claim 1 disposed on the other side with respect to the rotary plate.

* * * * *